United States Patent
Lee

(10) Patent No.: US 9,239,354 B2
(45) Date of Patent: Jan. 19, 2016

(54) PIN REMOVAL MODE SIGNAL GENERATION CIRCUIT AND SEMICONDUCTOR APPARATUS INCLUDING THE SAME

(71) Applicant: SK hynix Inc., Icheon-si Gyeonggi-do (KR)

(72) Inventor: Yong Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 276 days.

(21) Appl. No.: 13/708,147

(22) Filed: Dec. 7, 2012

(65) Prior Publication Data
US 2014/0002126 A1    Jan. 2, 2014

(30) Foreign Application Priority Data
Jun. 28, 2012   (KR) .................. 10-2012-0069819

(51) Int. Cl.
| | | |
|---|---|---|
| *G01R 31/02* | (2006.01) | |
| *G01R 31/26* | (2014.01) | |
| *G11C 29/12* | (2006.01) | |
| *G11C 29/46* | (2006.01) | |
| *G11C 29/48* | (2006.01) | |

(52) U.S. Cl.
CPC ........ *G01R 31/2607* (2013.01); *G11C 29/1201* (2013.01); *G11C 29/46* (2013.01); *G11C 29/48* (2013.01)

(58) Field of Classification Search
CPC ....... G06F 11/267; G06F 11/10; G06F 11/22; G06F 11/0757; G06F 11/1666; G06F 11/3466; G06F 11/349; G06F 13/4221; G06F 17/5027; G06F 17/5054; G06F 9/30145; G06F 11/202; G06F 17/505; G06F 11/2007; G06F 11/2017; G06F 19/3418; G06F 11/006; G01R 31/2806; G01R 31/2855; G01R 31/31905; G01R 31/2607; G01R 31/2831; H01L 2224/13; G05B 19/042; H03M 1/186; H04B 10/1143; H04Q 11/0478; G06N 3/063; G07C 2009/00388; G07C 2009/00412; G07C 9/00309; G07C 9/00857; G11C 29/1201; G11C 29/46; G11C 29/48; H04M 1/72522

See application file for complete search history.

(56) References Cited

U.S. PATENT DOCUMENTS

| | | | | |
|---|---|---|---|---|
| 4,628,448 | A * | 12/1986 | Murao | 712/39 |
| 5,627,478 | A * | 5/1997 | Habersetzer et al. | 324/750.3 |
| 5,677,885 | A * | 10/1997 | Roohparvar | 365/201 |
| 6,564,351 | B2 * | 5/2003 | Loughmiller | 714/745 |
| 2007/0067684 | A1 * | 3/2007 | Stolero et al. | 714/718 |

* cited by examiner

*Primary Examiner* — Vinh Nguyen
(74) *Attorney, Agent, or Firm* — William Park & Associates Ltd.

(57) ABSTRACT

A pin removal mode signal generation circuit includes: a set signal generation unit configured to activate a set signal when an activated test mode signal pulse is generated by a mode register set and an activated flag signal pulse is applied, and a pin removal mode signal generation unit configured to activate a pin removal mode signal when the set signal is activated, and deactivate the pin removal mode signal when a reset signal is activated.

20 Claims, 6 Drawing Sheets

PIN REMOVAL MODE SIGNAL GENERATION CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2012-0069819 filed on Jun. 28, 2012 in the Korean Intellectual Property Office, which is incorporated herein by reference in its entirety.

BACKGROUND

1. Technical Field

The present invention relates to semiconductor design technology, and more particularly, to a pin removal mode signal generation circuit and a semiconductor apparatus including the same.

2. Related Art

In order to test a packaged semiconductor apparatus, a test board and I/O pins are utilized. For memory chips, a plurality of memory chips are connected to a test board to perform tests concurrently, during which addresses and commands are inputted to the respective memory chips. Output signals of the memory chips are then measured to determine whether the corresponding memory chips failed or passed.

FIG. 1 is an address input waveform diagram of a conventional semiconductor apparatus during a test mode.

A packaged semiconductor memory apparatus has a plurality of pins defined in the specification. Referring to FIG. 1, the semiconductor memory apparatus receives addresses address0 to address14 corresponding to a plurality of address input pins A0 to A14 during the test mode. The semiconductor memory apparatus latches the addresses address0 to address14 in synchronization with a rising edge of a clock signal received through a clock input pin CLK.

FIG. 2 is a timing diagram when the conventional semiconductor memory apparatus enters the test mode.

With the diversification of functions, semiconductor memory apparatuses are designed to implement various operation modes. In particular, a semiconductor memory apparatus such as synchronous DRAM includes a mode register set circuit to set various operation modes. FIG. 2 illustrates an example of a method for activating a test mode signal TSET such that the mode register set circuit provided in the semiconductor memory apparatus enters the test mode.

A plurality of test set commands TMRS0 to TMRS2 are received through a command input pin CMD in synchronization with a clock signal received through a clock input pin CLK. When preset addresses are received through address input pins A7 to A10 when the plurality of test set commands TMRS0 to TMRS2 are received, an activated test mode signal pulse TSET is generated. Accordingly, the semiconductor memory apparatus enters the test mode.

Various methods for reducing test time required for a semiconductor memory apparatus have been proposed. The methods may include an address pin removal mode in which only a part of a plurality of address pins is used to connect a plurality of semiconductor memory apparatuses to a test board. In the address pin removal mode, only a part of the address pins are connected to the test board, and addresses are sequentially inputted to the connected address pins to perform tests. As a result, since a larger number of semiconductor memory apparatuses may be connected to the test board than during a normal test mode, more tests may be performed at the same time.

The standardization of a method for controlling a semiconductor memory apparatus to enter the address pin removal mode, as well as hardware developments to minimize additional area and to allow the method to occur in a stable manner, is in the process of being developed.

SUMMARY

In an embodiment, a pin removal mode signal generation circuit includes: a set signal generation unit configured to activate a set signal when an activated test mode signal pulse is generated by a mode register set and an activated flag signal pulse is applied; and a pin removal mode signal generation unit configured to activate a pin removal mode signal when the set signal is activated, and deactivate the pin removal mode signal when a reset signal is activated.

In another embodiment, a semiconductor apparatus includes: a pin removal mode signal generation circuit configured to activate a pin removal mode signal when an activated test mode signal pulse is generated by a mode register set and an activated flag signal pulse is applied; and a pin removal mode test circuit configured to latch a test address by receiving addresses through overall address pins during a normal test mode when the activated pin removal mode signal is not applied, and to latch the test address by sequentially receiving the addresses through a part of the address pins when the activated pin removal mode signal is applied.

In another embodiment, a semiconductor apparatus includes: a pin removal mode test circuit configured to latch a test address by receiving addresses through overall address pins during a normal test mode, and latch the test address by sequentially receiving the addresses through a part of the address pins during a pin removal mode; and a pin removal mode signal generation circuit configured to control the pin removal mode test circuit of entering the pin removal mode when an activated test mode signal pulse is generated by a mode register set and an activated flag signal pulse is applied, and control the pin removal mode test circuit of entering the normal test mode when the deactivated flag signal is applied.

BRIEF DESCRIPTION OF THE DRAWINGS

Features, aspects, and embodiments are described in conjunction with the attached drawings, in which.

DETAILED DESCRIPTION

Hereinafter, a pin removal mode signal generation circuit and a semiconductor apparatus including the same according to the present invention will be described below with reference to the accompanying drawings through various embodiments.

Figure 3:
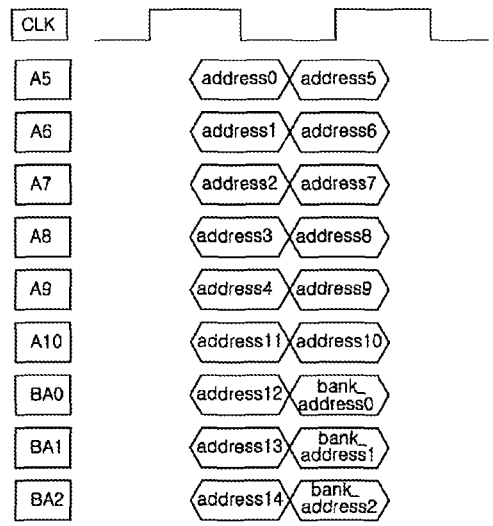
FIG. 3 is an address input waveform diagram of a semiconductor apparatus during an address pin removal mode according to one embodiment.

FIG. 3 is an address input waveform diagram of a semiconductor apparatus during an address pin removal mode according to one embodiment.

Referring to FIG. 3, the semiconductor apparatus according to an embodiment sequentially receives addresses through a part of overall address input pins. In this embodiment, a pin removal mode for memory cell addresses and bank addresses in a semiconductor memory chip will be described, but the present invention is not limited thereto. A pin removal mode that excludes connections between a test board and address pins corresponding to a half of total address pins will be described, but the present invention is not limited thereto.

According to an embodiment, only sixth to 11th address pins A5 to A10 and first to third bank address pins BA0 to BA2, among 18 total address pins and bank address pins, are connected to a test board. Connections of first to fifth address pins (not illustrated) and 12th to 15th address pins (not illustrated) to the test board are excluded.

Through the sixth to 11th address pins A5 to A10 and the first to third bank address pins BA0 to BA2, corresponding addresses address5 to addresss10 and bank addresses bank_address0 to bank_address2 are received in synchronization with a rising edge of a clock signal. At a falling edge of the clock signal before the addresses address5 to addresss10 and the bank addresses bank_address0 to bank_address2 are received through the sixth to 11th address pins A5 to A10 and the first to third bank address pins BA0 to BA2, addresses address0 to address4 and address11 to address14 corresponding to the removed address pins are received through any one of the connected address pins A5 to A10 and BA0 to BA2.

The semiconductor apparatus according to an embodiment first receives the addresses allocated to the removed address pins through the address pins connected to the test board, and then receives the addresses allocated to the corresponding address pins, during the pin removal mode.

Figure 4:
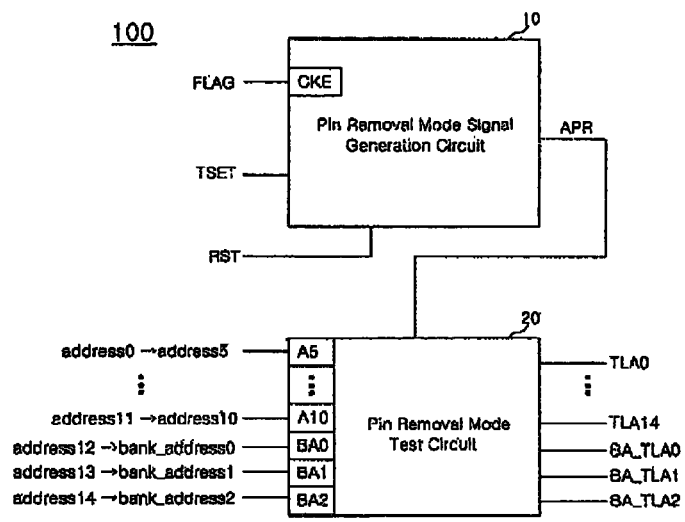
FIG. 4 is a block diagram of the semiconductor apparatus according to the embodiment.

FIG. 4 is a block diagram of the semiconductor apparatus 100 according to an embodiment.

The semiconductor apparatus 100 of FIG. 4 includes a pin removal mode signal generation circuit 10 and a pin removal mode test circuit 20.

The pin removal mode signal generation circuit 10 is configured to activate a pin removal mode signal APR when an activated test mode signal pulse TSET is generated by a mode register set (not illustrated) and an activated flag signal pulse FLAG is applied.

As described above, the test mode signal TSET is activated when a preset input is applied by the mode register set, thereby allowing the semiconductor apparatus to enter the test mode. The flag signal FLAG is separately applied to enable the pin removal mode. When the semiconductor apparatus is to operate in the pin removal mode concurrently with the test mode, the pin removal mode signal APR is activated.

In this embodiment, the flag signal FLAG may be applied through an input pin from the outside. For example, the flag signal FLAG may be received through a clock enable signal input pin CKE.

The respective input pins of the semiconductor apparatus receive input signals defined in the specification, and the clock enable signal input pin CKE receives a clock enable signal defined in the specification. The clock enable signal is a signal for controlling a clock signal to be received during an activation period of the corresponding signal. The semiconductor apparatus needs to receive an activated clock enable signal through the clock enable signal input pin CKE in order to operate in synchronization with a clock signal during the test mode, and needs to receive an activated flag signal in order to enter the pin removal mode. Therefore, when the clock enable signal is a signal activated to a high level, the flag signal FLAG may be activated to a low level such that the two signals are distinguished from each other. This is similar to the case where a low-level pulse signal is applied to the clock enable signal input pin CKE, when the test is to be performed in the pin removal mode. Applying the activated flag signal FLAG may not have an effect on the clock synchronization operation of the semiconductor apparatus.

The pin removal mode test circuit 20 receives the addresses address0 to address14 and bank_address0 to bank_address2 through the entire address pins (only partial address pins are shown in FIG. 4) and latches test addresses TLA0 to TLA14 and BA_TLA0 to BA_TLA2 during a normal test mode. However, when the pin removal mode signal APR is applied, the pin removal mode test circuit 20 sequentially receives the addresses address0 to address14 and bank_address0 to bank_address2 through some address pins A5 to A10 and BA0 to BA2, and latches the test addresses TLA0 to TLA14 and BA_TLA0 to BA_TLA2.

Figure 5:
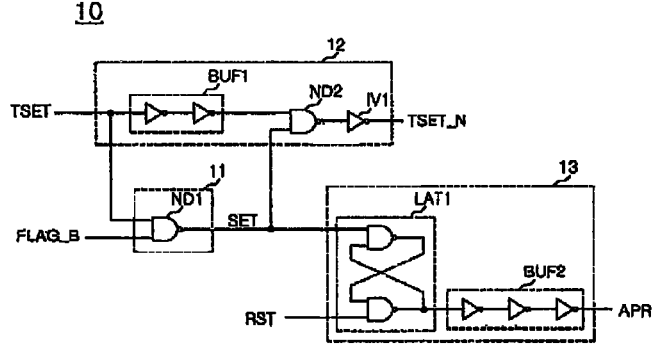
FIG. 5 is a circuit diagram illustrating a specific embodiment of a pin removal mode signal generation circuit of FIG. 4.

FIG. 5 is a circuit diagram illustrating a specific embodiment of the pin removal mode signal generation circuit 10 of FIG. 4.

The pin removal mode signal generation circuit 10 includes a set signal generation unit 11, a normal test mode signal generation unit 12, and a pin removal mode signal generation unit 13.

The set signal generation unit 11 is configured to activate a set signal SET when the activated test mode signal TSET is generated and the activated flag signal pulse FLAG is applied.

Specifically, the set signal generation unit 11 may include a first NAND gate ND1 configured to receive the test mode signal TSET and the inverted flag signal FLAG_B and output the set signal SET. The set signal SET is a signal activated to a low level.

The normal test mode signal generation unit 12 is configured to generate a normal test mode signal TSET_N which is activated in a normal test mode, not in the pin removal mode. The normal test mode signal generation unit 12 generates the activated normal test mode signal TSET_N when the activated test mode signal pulse TSET is generated and the set signal SET is deactivated.

Specifically, the normal test mode signal generation unit 12 includes a first buffer BUF1, a second NAND gate ND2, and a first inverter IV1.

The first buffer BUF1 is configured to buffer the test mode signal TSET and output the buffered test mode signal TSET.

The second NAND gate ND2 is configured to perform a NAND operation on the buffered test mode signal TSET and the set signal SET.

The first inverter IV1 is configured to invert an output of the second NAND gate ND2 and output the inverted signal as the normal test mode signal TSET_N.

The pin removal mode signal generation unit 13 is configured to activate the pin removal mode signal APR when the set signal SET is activated, and deactivate the pin removal mode signal APR when a reset signal RST is activated. The reset signal RST is a signal applied to reset the semiconductor apparatus, and may be applied from the outside.

Specifically, the pin removal mode signal generation unit 13 may include a first latch LAT1 and a second buffer BUF2.

The first latch LAT1 may include two NAND gates configured to receive two inputs. The first latch LAT1 receives the activated set signal SET to generate an output signal activated to a low level and receives the activated reset signal RST to generate an output signal deactivated to a high level.

The second buffer BUF2 buffers the output signal of the first latch LAT1 and outputs the pin removal mode signal APR.

When the test mode signal TSET is internally activated and the activated flag signal FLAG is applied from the outside, the pin removal mode signal generation circuit 10 activates the pin removal mode signal APR to enter the address pin removal mode.

Figure 6:
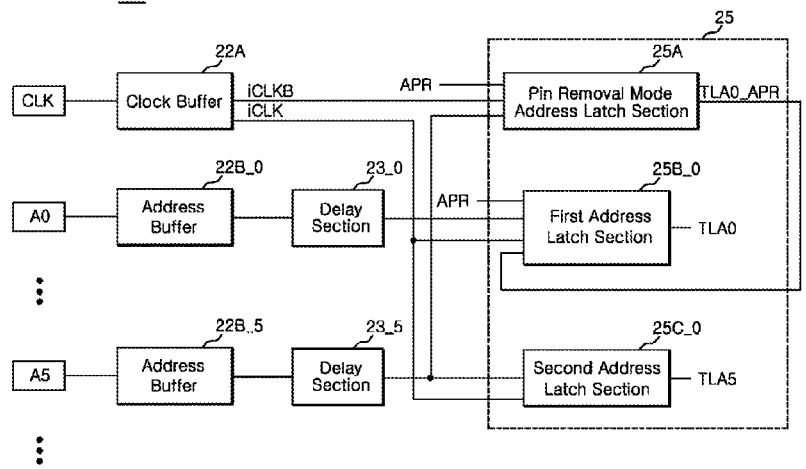
FIG. 6 is a block diagram illustrating a specific embodiment of a pin removal mode test circuit of FIG. 4.

FIG. 6 is a block diagram illustrating a specific embodiment of the pin removal mode test circuit 20 of FIG. 4.

The pin removal mode test circuit 20 includes an address latch unit 25. The address latch unit 25 performs different address latch operations depending on whether the pin removal mode signal APR is activated or deactivated.

The pin removal mode test circuit 20 receives a clock signal through a clock input pin CLK, buffers the clock signal through a clock buffer 22A, and generates a clock signal iCLK and an inverted clock signal iCLKB.

The pin removal mode test circuit 20 receives addresses allocated through a plurality of address pins. FIG. 6 illustrates only paths through which addresses are inputted through a first address pin A0 and a sixth address pin A5, but the pin removal mode test circuit 20 may include additional address input paths. The addresses received through the first and sixth address pins A0 and A5 are buffered by address buffers 22B_0 and 22B_5, respectively, delayed by a predetermined time through delay sections 23_0 and 23_5, respectively, and transferred to the address latch unit 25.

The first address pin A0 represents address input pins which are removed during the pin removal mode, and the sixth address pin A5 represents address input pins which are not removed during the pin removal mode. During the normal test mode, a first address is applied to the first address pin A0, and a sixth address is applied to the sixth address pin A5. During the pin removal mode, however, the first and sixth addresses are sequentially applied to the sixth address pin A5. Hereafter, the first address is referred to as a former-entry address, and the sixth address is referred to as a latter-entry address.

The address latch unit 25 includes a pin removal mode address latch section 25A, a first address latch section 25B_0, and a second address latch section 25C_0.

The pin removal mode address latch section 25A serves to first latch the former-entry address during the pin removal mode. When the activated pin removal mode signal APR is applied, the pin removal mode address latch section 25A latches the former-entry address received through the sixth address input pin A5 in synchronization with the inverted clock signal iCLKB, and outputs the latched signal as a first removal address TLA0_APR.

The first address latch section 25B_0 serves to latch the first test address TLA0. The first address latch section 25B_0 latches the first address received through the first address input pin A0 as the first test address TLA0 in synchronization with the clock signal iCLK during the normal test mode, and latches the first pin removal address TLA0_APR as the first test address TLA0 in synchronization with the clock signal iCLK when the activated pin removal mode signal APR is applied. Although not illustrated, the first address latch section 25B_0 may include a pass gate to decide whether or not to transfer an input signal in response to the pin removal mode signal APR.

The second address latch section 25C_0 serves to latch the sixth test address TLA5. The second address latch section 25C_0 latches an address inputted through the sixth address input pin A5 as the sixth test address TLA5. During the pin removal mode, the second address latch section 25C_0 latches the latter-entry address received through the sixth address input pin A5 as the sixth test address TLA5 in synchronization with the clock signal iCLK.

Since the first pin removal address TLA0_APR is latched in synchronization with the inverted clock signal iCLKB, the phase of the first pin removal address TLA0_APR may lead the phase of the first test address TLA0 by a half clock. Since the first test address TLA0 and the sixth test address TLA5 are latched in synchronization with the clock signal iCLK, the first test address TLA0 and the sixth test address TLA5 may be latched at the same phase.

Although a part of the overall address input pins of the semiconductor apparatus is not connected to the test board during the pin removal mode, all of the addresses may be latched concurrently.

Figure 7:
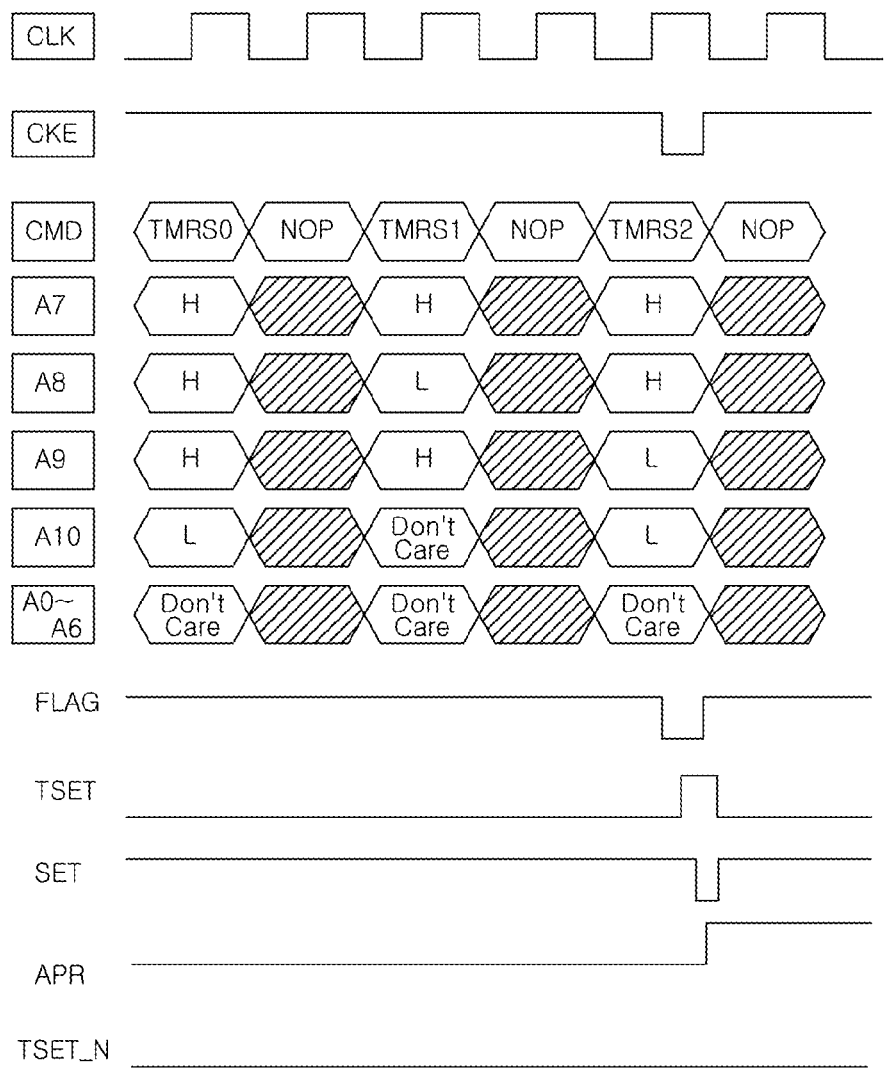
FIG. 7 is a timing diagram when the semiconductor apparatus of FIGS. 4 to 6 enters the address pin removal mode.

FIG. 7 is a timing diagram when the semiconductor apparatus of FIGS. 4 to 6 enters the address pin removal mode.

Figure 8:
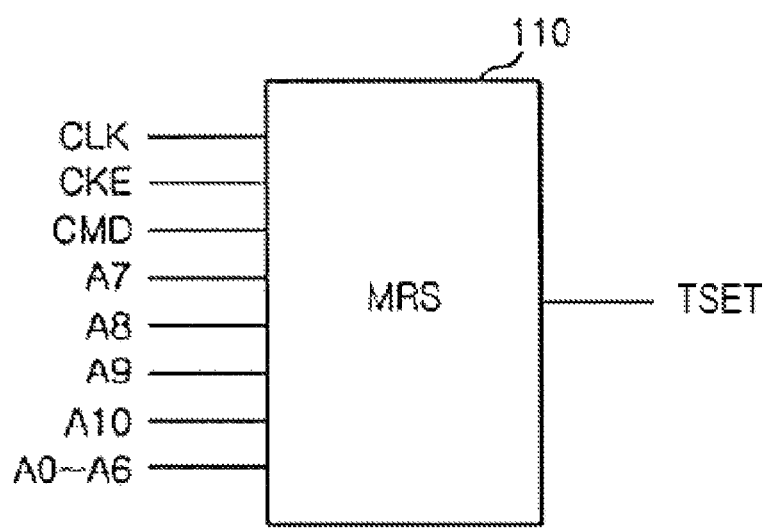
FIG. 8 is a block diagram of the mode register set circuit of the present embodiment.

FIG. 8 is a block diagram of the mode register set circuit of the present embodiment.

Figure 1:
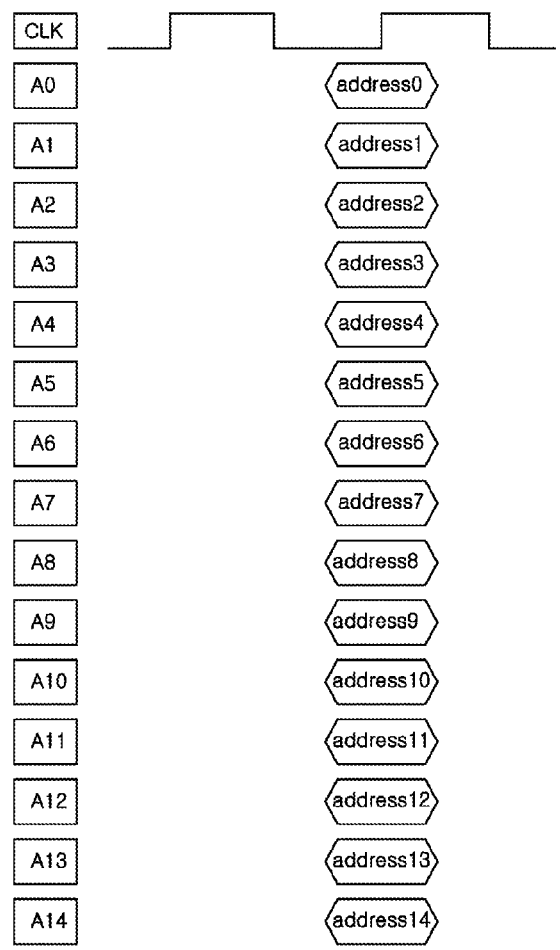
FIG. 1 is an address input waveform diagram of a conventional semiconductor apparatus during a test mode.
Figure 2:
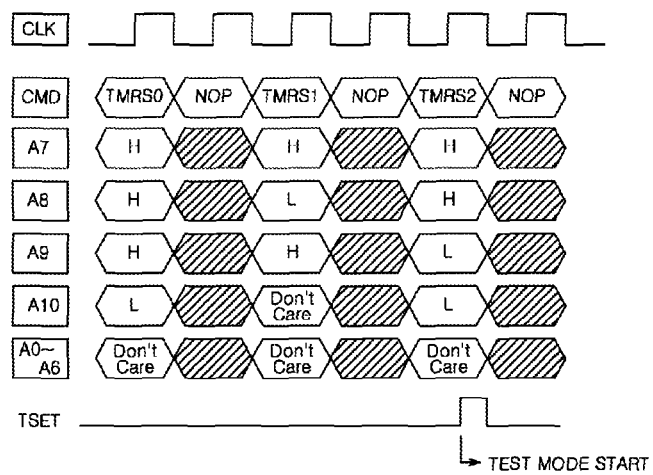
FIG. 2 is a timing diagram when the conventional semiconductor memory apparatus enters the test mode.

As shown in FIG. 7 and FIG. 8, the mode register set circuit 110 provided in the semiconductor apparatus activates the test mode signal TSET according to a preset input, for example, a plurality of test set commands TMRS0 to TMRS2 received through a command input pin CMD in synchronization with a clock signal received through a clock input pin CLK, as described FIG. 2. When preset addresses are received through address input pins A7 to A10 when the plurality of test set commands TMRS0 to TMRS2 are received, an activated test mode signal pulse TSET is generated. Accordingly, the semiconductor memory apparatus enters the test mode. In order to enter the pin removal mode, a low-level pulse is applied to the clock enable signal input pin CKE when the test mode signal TSET is activated. The activated flag signal pulse FLAG is also applied to the clock enable signal input pin CKE.

When the test mode signal TSET and the flag signal FLAG are activated at the same time, an activated set signal pulse SET is generated, and thus the pin removal mode signal APR is activated. On the other hand, the normal test signal TSET_N is deactivated. Therefore, the semiconductor apparatus according to the embodiment performs a test in the pin removal mode.

When the test mode signal TSET is activated but the activated flag signal FLAG is not applied, the pin removal mode signal APR is deactivated, and the normal test signal TSET_N is activated. Therefore, the semiconductor apparatus according to the embodiment performs a normal test operation.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A pin removal mode signal generation circuit included in a semiconductor device, comprising:
   a set signal generation unit configured to activate a set signal when a test mode signal is activated and a flag signal is activated; and
   a pin removal mode signal generation unit configured to receive the set signal and a reset signal, activate a pin removal mode signal when the set signal is activated, and deactivate the pin removal mode signal when the reset signal is activated, wherein the reset signal is generated when the semiconductor device is reset.

2. The pin removal mode signal generation circuit according to claim 1, further comprising an external clock enable signal input pin receiving a clock enable signal, wherein when the clock enable signal is activated to a low level, the clock enable signal becomes the flag signal, and wherein the set signal generation unit generates the set signal having the active state when the clock enable signal becomes the flag signal.

3. The pin removal mode signal generation circuit according to claim 2, wherein the flag signal is activated to a low level when the clock enable signal is activated to a high level.

4. The pin removal mode signal generation circuit according to claim 3, wherein the set signal generation unit comprises a NAND gate configured to receive the test mode signal and a signal obtained by inverting the flag signal and output the set signal.

5. The pin removal mode signal generation circuit according to claim 4, wherein the pin removal mode signal generation unit comprises a latch configured to receive the set signal and the reset signal.

6. The pin removal mode signal generation circuit according to claim 1, further comprising a normal test mode signal generation unit configured to generate an activated normal test mode signal when the test mode signal is activated and the flag signal is deactivated.

7. A semiconductor apparatus comprising:
a pin removal mode signal generation circuit configured to activate a pin removal mode signal when an activated test mode signal pulse is generated by a mode register set and an activated flag signal pulse is applied; and
a pin removal mode test circuit configured to latch a test address by receiving addresses through overall address pins during a normal test mode when the activated pin removal mode signal is not applied, and to latch the test address by sequentially receiving the addresses through a part of the address pins when the activated pin removal mode signal is applied.

8. The semiconductor apparatus according to claim 7, wherein the pin removal mode signal generation circuit further comprises an external clock enable signal input pin receiving a clock enable signal and the flag signal pulse is applied through the external clock enable signal input pin, and wherein the external clock enable signal input pin is configured to receive the clock enable signal when the pin removal mode signal is not activated and to receive the flag signal pulse when the pin removal mode signal is activated.

9. The semiconductor apparatus according to claim 8, wherein the flag signal pulse is activated to a low level when the clock enable signal is activated to a high level.

10. The semiconductor apparatus according to claim 7, wherein the pin removal mode signal generation circuit comprises:
a set signal generation unit configured to activate a set signal when the activated test mode signal pulse is generated and the activated flag signal pulse is applied; and
a pin removal mode signal generation unit configured to receive the set signal and a reset signal, activate the pin removal mode signal when the set signal is activated, and deactivate the pin removal mode signal when the reset signal is activated, wherein the reset signal is generated when a semiconductor apparatus is reset.

11. The semiconductor apparatus according to claim 7, wherein the pin removal mode test circuit comprises:
a pin removal mode address latch section configured to latch a former-entry address received through a first address input pin in synchronization with an inverted clock signal and output the latched signal as a first pin removal address, when the activated pin removal mode signal is applied;
a first address latch section configured to latch the first pin removal address as a first test address in synchronization with a clock signal when the activated pin removal mode signal is applied; and
a second address latch section configured to latch a latter-entry address received through the second address input pin as a second test address in synchronization with the clock signal.

12. The semiconductor apparatus according to claim 11, wherein a phase of the first pin removal address leads a phase of the first test address by a half clock, and the phase of the first test address and a phase of the second test address are identical to each other.

13. The semiconductor apparatus according to claim 11, wherein the first address latch section latches an address received through a first address input pin as the first test address in synchronization with the clock signal during the normal test mode.

14. A semiconductor apparatus comprising:
a pin removal mode test circuit configured to latch a test address by receiving addresses through overall address pins during a normal test mode, and latch the test address by sequentially receiving the addresses through a part of the address pins during a pin removal mode; and
a pin removal mode signal generation circuit configured to control the pin removal mode test circuit of entering the pin removal mode when an activated test mode signal pulse is generated by a mode register set and an activated flag signal pulse is applied, and control the pin removal mode test circuit of entering the normal test mode when a deactivated flag signal is applied.

15. The semiconductor apparatus according to claim 14, wherein the pin removal mode signal generation circuit further comprises an external clock enable signal input pin receiving a clock enable signal and the flag signal pulse is applied through the external clock enable signal input pin, and wherein the external clock enable signal input pin is configured to receive the clock enable signal during the normal test mode and to receive the flag signal pulse during the pin removal mode.

16. The semiconductor apparatus according to claim 15, wherein the flag signal pulse is activated to a low level when the clock enable signal is activated to a high level.

17. The semiconductor apparatus according to claim 14, wherein the pin removal mode signal generation circuit comprises:
a set signal generation unit configured to activate a set signal when the activated test mode signal pulse is generated and the activated flag signal pulse is applied;
a normal test mode signal generation unit configured to generate an activated normal test mode signal when the activated test mode signal pulse is generated and the set signal is deactivated; and a pin removal mode signal generation unit configured to receive the set signal and a reset signal, activate a pin removal mode signal when the set signal is activated, and deactivate the pin removal mode signal when the reset signal is activated, wherein the reset signal is generated when a semiconductor apparatus is reset.

18. The semiconductor apparatus according to claim 14, wherein the pin removal mode test circuit comprises:
a pin removal mode address latch section configured to latch a former-entry address received through a second address input pin in synchronization with an inverted clock signal and output the latched signal as a first pin removal address, during the pin removal mode;
a first address latch section configured to latch the first pin removal address as a first test address in synchronization with a clock signal during the pin removal mode; and
a second address latch section configured to latch a latter-entry address received through the second address input pin as a second test address in synchronization with the clock signal.

19. The semiconductor apparatus according to claim 18, wherein a phase of the first pin removal address leads a phase of the first test address by a half clock, and the phase of the first test address and a phase of the second test address are identical to each other.

20. The semiconductor apparatus according to claim 18, wherein the first address latch section latches an address received through a first address input pin as the first test address in synchronization with the clock signal in the normal test mode.

* * * * *